US007127359B2

(12) United States Patent
Chityala et al.

(10) Patent No.: US 7,127,359 B2
(45) Date of Patent: Oct. 24, 2006

(54) REAL-TIME MATHEMATICAL MODEL FOR WAFER SPIN DEFECT DETECTION AND FOR MISALIGNMENT ANALYSES

(75) Inventors: Aditya Chityala, Dallas, TX (US); Errol Philip Akomer, Plano, TX (US); Jason Charles Tervooren, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/067,786

(22) Filed: Mar. 1, 2005

(65) Prior Publication Data

US 2006/0212245 A1    Sep. 21, 2006

(51) Int. Cl.
*G06F 19/00* (2006.01)

(52) U.S. Cl. ............................ 702/35; 702/36; 702/81; 702/83; 703/2

(58) Field of Classification Search ............ 702/30, 702/35, 36, 40, 58, 59, 81–84, 108, 117, 118, 702/179, 185; 700/109, 110, 119–121
See application file for complete search history.

(56) References Cited

U.S. PATENT DOCUMENTS

| 5,664,987 A | * | 9/1997 | Renteln .................. 451/21 |
| 6,100,101 A | * | 8/2000 | Marathe et al. ............ 438/14 |
| 6,185,472 B1 | * | 2/2001 | Onga et al. .............. 700/121 |
| 6,723,574 B1 | * | 4/2004 | Bailey et al. ............. 438/16 |

* cited by examiner

*Primary Examiner*—Hal Wachsman
(74) *Attorney, Agent, or Firm*—Peter K. McLarty; W. James Brady, III; Frederick J. Telecky, Jr.

(57) ABSTRACT

According to various embodiments, there is a method of inspecting semiconductor wafers comprising comparing a value for each wafer in a lot of wafers to a mathematical model, where the values include data about at least one feature on the wafers, and where the mathematical model comprises a threshold value corresponding to the at least one feature, and further where values greater than the threshold value comprise an indication of a spin defect. The method can also comprise determining whether any of the values of the wafers in the lot are not greater than the threshold value, grouping into a group (P) those wafers whose values are not greater than the threshold value, and flagging for further inspection those wafers having values greater than the threshold value.

18 Claims, 4 Drawing Sheets

US 7,127,359 B2

REAL-TIME MATHEMATICAL MODEL FOR WAFER SPIN DEFECT DETECTION AND FOR MISALIGNMENT ANALYSES

FIELD OF THE INVENTION

The subject matter of this application relates to inspecting a semiconductor wafer. More particularly, the subject matter of this invention relates to a method and a device used for inspecting a semiconducting wafer during the manufacturing process.

BACKGROUND OF THE INVENTION

Critical dimensions (CD) of semiconductor devices continue to shrink. With smaller CD comes increased attention to minimizing errors associated with the photolithography processes used to make the devices. Common photolithography errors that are monitored include those from wafer and mask misalignment. Indeed, misalignment of the mask with respect to the wafer causes an element of a device to be formed at an improper position. If the alignment is off by an unacceptable amount, the devices do not function properly.

Another error of photolithography to be monitored is the error associated with photolithographic shot placement. During device processing a single mask may be used multiple times to expose the semiconductor wafer. This is often the case when the pattern of the mask is placed and shot (i.e., exposed) multiple times across the same device or across multiple devices on the same wafer. Improper alignment of the shot placement, however, causes a device or an element of a device to be formed at an improper position. Again, if the alignment is off by an unacceptable amount, an individual device or all of the devices, on a wafer do not function properly.

Unfortunately, however, the methods and devices commonly used to inspect for errors are complicated and are limited to inspecting only a few types of errors that can arise during manufacturing. Accordingly, embodiments of the invention described herein improve the error inspection processes and can inspect semiconductor wafers for additional types of errors that are currently neglected during manufacturing.

SUMMARY OF THE INVENTION

According to various embodiments, there is a method of inspecting semiconductor wafers comprising comparing a value for each wafer in a lot of wafers to a mathematical model, where the values include data about at least one feature on the wafers, and where the mathematical model comprises a threshold value corresponding to the at least one feature, and further where values greater than the threshold value comprise an indication of a spin defect. The method can also comprise determining whether any of the values of the wafers in the lot are not greater than the threshold value, grouping into a group (P) those wafers whose values are not greater than the threshold value, and flagging for further inspection those wafers having values greater than the threshold value.

According to other embodiments, there is a method of inspecting semiconductor wafers comprising comparing a Residual 3 Sigma value corresponding to at least one feature on a wafer in a lot of wafers to a mathematical model, where the mathematical model comprises a threshold value corresponding to the plurality of features of the wafers. The method can also comprise determining whether the Residual 3 Sigma values for each wafer in the lot are not greater than the threshold value, grouping into a group (P) those wafers whose Residual 3 Sigma values are not greater than the threshold value, calculating a standard deviation ($\sigma_L$) and a mean ($\mu_L$) for the Residual 3 Sigma values for the wafers in the lot, and calculating a standard deviation ($\sigma_P$) and a mean ($\mu_P$) for the Residual 3 Sigma values for the wafers in the group (P). Further, the method can flag the lot for further inspection if:

$$(\sigma_L/\mu_L)_{Lot} - (\sigma_P/\mu_P)_P > (x)$$

where (x) is a predetermined threshold amount, and where $(\sigma_L/\mu_L)_{Lot}$ represents the standard deviation of the Residual 3 Sigma values for the lot divided by the mean of the Residual 3 Sigma values for the lot, and further where $(\sigma_P/\mu_P)_P$ represents the standard deviation of the Residual 3 Sigma values for the group (P) divided by the mean of the Residual 3 Sigma values for the group (P).

According to still other embodiments, there is a computer readable medium for use in inspecting semiconductor wafers comprising program code for comparing a value for each wafer in a lot of wafers to a mathematical model, where the values include data about at least one feature on the wafers, and where the mathematical model comprises a threshold value corresponding to the at least one feature, and further where values greater than the threshold value comprise an indication of a spin defect. The computer readable medium can also comprise program code for determining whether any of the values of the wafers in the lot are not greater than the threshold value, program code for grouping into a group (P) those wafers whose values are not greater than the threshold value, and program code for flagging for further inspection those wafers having values greater than the threshold value.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers will be used throughout the drawings to refer to the same or like parts.

According to various embodiments, there is a method for inspecting semiconductor wafers during fabrication. Methods described herein can be used at various stages during the manufacture of various semiconductor devices. Persons skilled in the art will understand that an apparatus, such as a computer-based lithography system, including optical elements, a data processor, memory, input/output (I/O), program storage, a connecting bus, and other components, can be programmed or otherwise designed to be used with the various methods described herein. As will be understood, an article of manufacture, such as a computer program, can be used with the computer-based lithography system.

Figure 1:
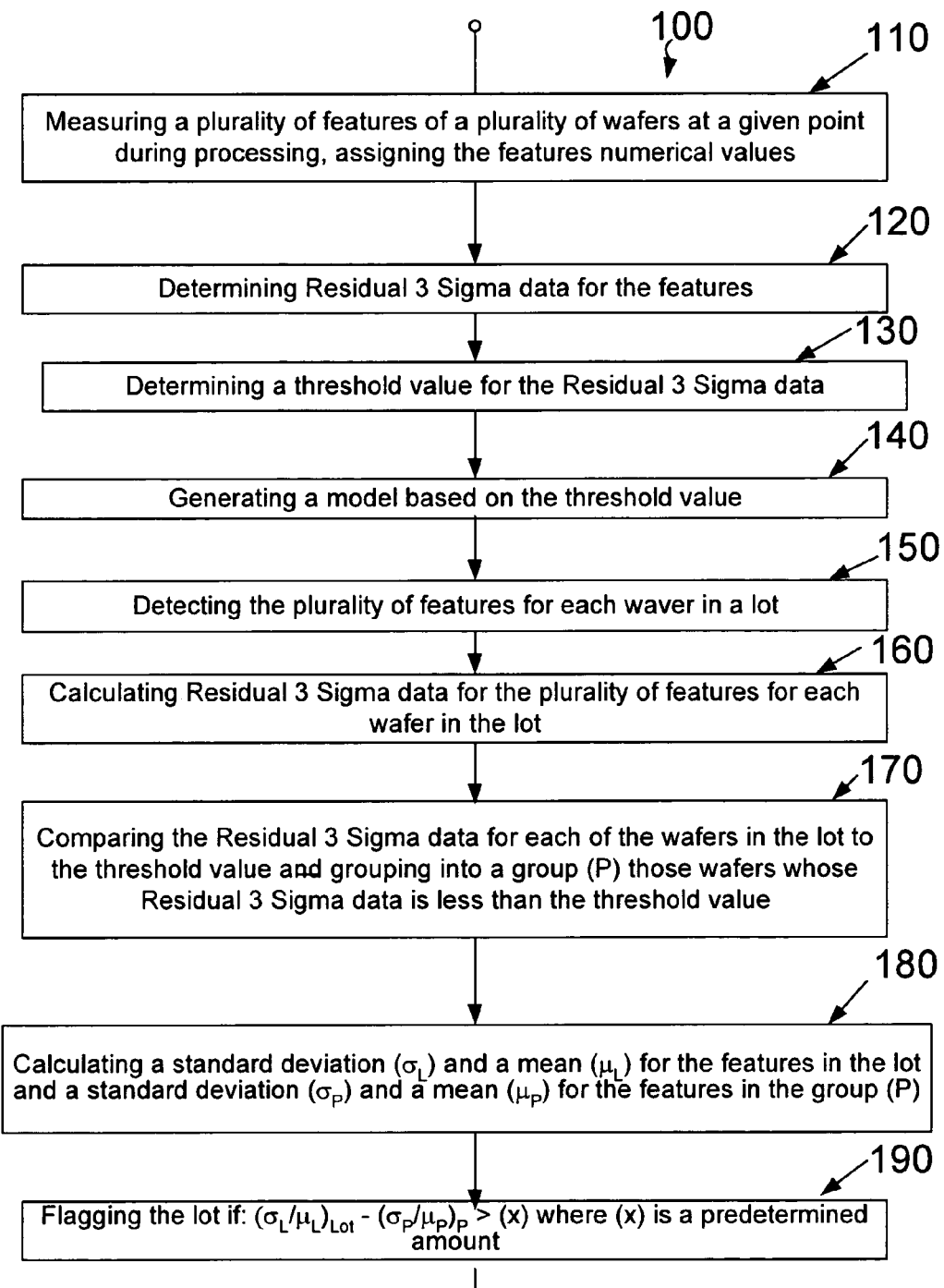
FIG. 1 is an exemplary flow chart showing the general operation of the method for wafer inspection according to various embodiments of the invention.

FIG. 1 shows a flow chart 100 illustrating an exemplary method for inspecting semiconductor wafers during a device manufacturing process. According to various embodiments, a mathematical model can be generated and used to inspect semiconductor wafers. The mathematical model can be generated, for example, by inspecting a series of wafers, which for ease of description can be termed "test wafers." Even though the wafers are termed test wafers, they can be wafers used in actual production or they can be wafers used specifically to generate the model.

In the flow chart, at 110 a plurality of features on a plurality of test wafers are inspected. As used herein, the term "feature" generally refers to aspects of a wafer that can be measured. Exemplary features can include, for example, resist thickness and alignment data. Features can also include data relating to the accuracy of the alignment of a wafer on a stage of a tool at a particular step during photolithography. For example, a tool, such as a stepper, can measure and calculate accuracy of a stage through a few sample exposure shots. This data can then be used during exposure of the wafer. Further, this data can be compensatory values that can be used by the stepper to optimize wafer alignment. The data can comprise the following: wafer rotation, wafer scaling, and low magnification offset.

According to various embodiments, wafer rotation data can provide information about stage orthogonality. For example, from the information about the rotation of the wafer along the X-axis and Y-axis, the stepper can calculate stage orthogonality. Orthogonality can be measured in ppm. Stage orthoginality can be defined as: (Yrot−Xrot), where Yrot signifies the Y translational shift as a function of the X position and Xrot signifies the X rotation as a function of the Y position. As such, orthogonality, can be defined as the difference (Yrot−Xrot) in rotations. In the ideal case, the difference (Yrot−Xrot) would be zero.

According to various embodiments, wafer scaling data can provide information about the translational change as a function of the position. This information can be provided in units of parts per million (ppm). Wafer scaling data can be determined by the stepper. For example, for the X direction, there can be an X translational shift amount as a function of the X position on the wafer. Similar, for the Y direction there can be a Y translational shift amount as a function of the Y position on the wafer.

According to various embodiments, low magnification offset ("Low Mag Offset") can represent the X and Y translational offset as the wafer stage moves from off-axis television pre-alignment to on-axis advanced global alignment. Low Mag Offset can be measured in micrometers.

During the inspection process, features can be assigned numerical values. Further, according to various embodiments, at least some of the numerical values can be combined to form a single value. Residual 3 Sigma data can be calculated for each of the features and/or the single value. As is known in the art, Residual 3 Sigma data is a statistical measure that can represent the variance of residual error from various measurements, such as those described herein. According to various embodiments, Residual 3 Sigma data can be used as an indicator of the expected printed results on a wafer.

As an illustrative example, at a predetermined step in the manufacturing process, multiples features can be measured. Each of the features for a particular wafer can be assigned numerical values. At least one, and in some embodiments all, of the numerical values can be combined for a test wafer to form a single numerical value. According to various embodiments, multiple test wafers can be similarly measured at the predetermined step. The numerical values for the feature(s) for the other test wafers can be similarly combined to form a set of numerical values. As shown at 120, Residual 3 Sigma data based on the features can then be calculated for the test wafers at the predetermined step.

According to various embodiments, the features on the test wafers can be measured by an inspection tool or they can be manually measured by an operator. Either the inspection tool or the operator can assign the numerical values to the features on the test wafers. According to various embodiments, Residual 3 Sigma values greater than a threshold value can indicate unacceptable errors in the photolithography process. As shown at 130, the threshold value can be determined empirically or by mathematical analyses. Further, as shown at 140 the mathematical model can be generated using at least one of the features, numerical values, Residual 3 Sigma data, and threshold value.

According to various embodiments, a threshold value T can be determined by examining a plurality of wafer lots that have been processed on a particular stepper-level combination. As an illustrative example, 10 to 15 wafer lots with each lot having a plurality of wafers can be measured. According to various embodiments, the threshold value T can be calculated as:

$$T=\mu+2\sigma \qquad (1)$$

where $\mu$ represents an average (mean) of the Residual 3 Sigma values for the whole group of wafers, i.e., each wafer in each lot, and where $2\sigma$ represents a standard deviation for the entire group of wafers.

According to various embodiments, the Residual 3 Sigma data and/or the threshold value(s) can be used to determine which numerical values of the features, either separately or in combination, are within acceptable tolerance ranges. Moreover, Residual 3 Sigma data and/or threshold value(s) can be generated for a plurality of processing tools, such as steppers, or they can be generated for a specific process tool. Still further, the Residual 3 Sigma data and/or threshold value(s) can be generated for the specific process tool at a specific log-point in the process. Similarly, a mathematical model can be generated for the plurality of processing tools. A mathematical model can also be generated for a specific tool and/or a specific log-point in the process.

According to various embodiments, the Residual 3 Sigma data and/or threshold value(s) can be used for a variety of applications. For example, they can be used to monitor machine performance and they can be used as a means of preventative maintenance. For example, trends in the feature measurements can be evaluated, as well as the stability of orthogonality and magnification offset, to determine if any drift in alignment is observed. Further, the features and Residual 3 Sigma data can be used to evaluate alignment performance of various illumination conditions for preliminary comparisons.

Figure 2A:
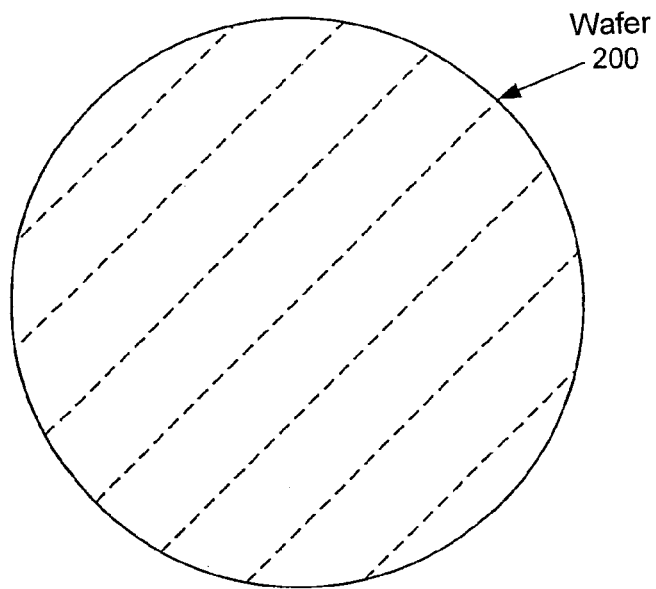
FIG. 2A illustrates a top-down view of a layer properly disposed on a semiconductor wafer.
Figure 2B:
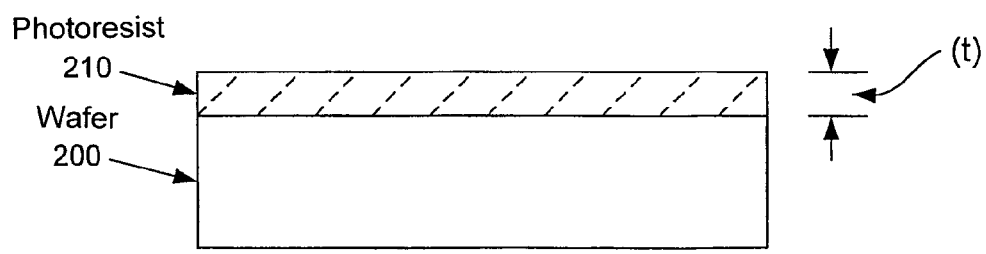
FIG. 2B illustrates a cross-sectional view of the layer properly disposed on the semiconductor wafer shown in FIG. 2A.

According to various embodiments, a feature that can be inspected to monitor processing is photoresist thickness. Photoresist can be deposited on a wafer at various times in device processing by various techniques. One such technique includes a spin-on method, as is known to one of ordinary skill in the art. As shown in FIGS. 2A and 2B, when properly applied, the photoresist has a relatively uniform thickness (t) across the wafer 200. For example, FIG. 2A shows a top down view of wafer 200 having a photoresist uniformly distributed across the wafer. FIG. 2B shows a cross-sectional diagram of wafer 200 and photoresist 210. As can be seen in FIG. 2B, photoresist 210 has a thickness (t) that is relatively uniform across wafer 200. Properly applied photoresist 210 provides controllable processing of wafer 200.

Problems can arise, however, when the thickness of the photoresist is not uniform. In these and other instances, the photoresist can comprise a spin defect. The term "spin defect," as used herein, refers to an irregularity in thickness of the resist across the wafer. Irregularity can comprise both non-uniformity of thickness and a complete lack of resist coverage in some area of the wafer. Large variations in resist thickness can lead to defects ranging from scumming, where there is residual photoresist in exposed areas of the wafer, to the situation where no pattern has been transferred.

Figure 2C:
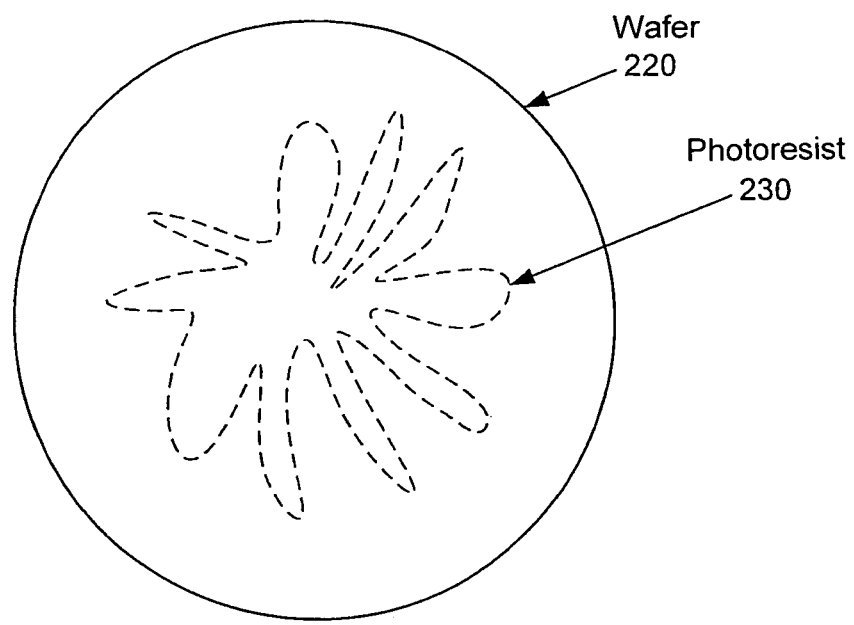
FIG. 2C illustrates a top-down view of a layer improperly disposed on a semiconductor wafer.
Figure 2D:
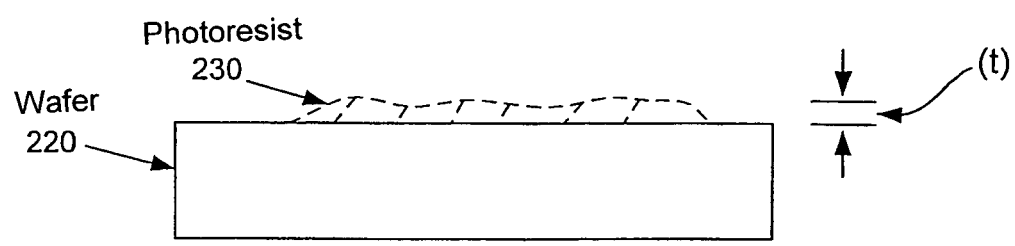
FIG. 2D illustrates a cross-sectional view of the layer improperly disposed on the semiconductor wafer shown in FIG. 2C.

For example, FIG. 2C shows a top down view of wafer 220 having a photoresist 230 waving a spin defect. As can be seen in FIG. 2C, photoresist 230 displays a smeared pattern, which is an indication of a spin defect. Further, FIG. 2D shows a cross-sectional view of wafer 220 with photoresist 230 having the spin defect. As can be seen in FIG. 2D, the thickness (t) of photoresist 230 is not uniform across wafer 220. In some areas, photoresist 230 is thicker than in other areas. These irregularities can be considered spin defects.

According to various embodiments, after the model has been generated, at 150 at least one feature of semiconductor wafers in a lot during device fabrication can be inspected. These features can be assigned numerical values. A lot of wafers can be understood to be a group of wafers that are processed in a single batch. Lots typically comprise multiple wafers, such as, for example, from 10 to 30 wafers. Nevertheless, lots can comprise more or less wafers than these amounts. As shown at 160, calculations can be done on the numerical values for each wafer in the lot to determine a Residual 3 Sigma value for that wafer and/or all of the wafers in the lot. According to various embodiments, after each wafer in a given lot is processed on the stepper, the Residual 3 Sigma value for that wafer is passed to the mathematical model. As shown at 170, the model then compares this value to the threshold value. If the Residual 3 Sigma value for that wafer is less than the threshold, the model stores it in a group, for example, called group (P). According to various embodiments, the number of wafers in the group (P) is at least half the number of wafers in a lot.

As shown at 180, after a predetermined number of wafers have been processed, the model calculates a mean ($\mu_L$) and a standard deviation ($\sigma_L$) of the Residual 3 Sigma values for the lot and a mean ($\mu_P$) and a standard deviation ($\sigma_P$) of the Residual 3 Sigma values for the group (P). Next, $(\sigma_L/\mu_L)_{Lot}$ and $(\sigma_P/\mu_P)_P$ are calculated, where $(\sigma_L/\mu_L)_{Lot}$ represents the standard deviation of the Residual 3 Sigma values for the lot divided by the mean of the Residual 3 Sigma values for the lot, and where $(\sigma_P/\mu_P)_P$ represents the standard deviation of the Residual 3 Sigma values for the group (P) divided by the mean of the Residual 3 Sigma values for the group (P). According to various embodiments, if $$(\sigma_L/\mu_L)_{Lot} - (\sigma_P/\mu_P)_P > (x) \qquad (2)$$

where (x) is a predetermined threshold value, the model can flag the lot on the manufacturing mainframe computer system for further inspection, as shown at 180. According to various embodiments, the lot can be held for inspection before it can progress to the next set of operations. According to various embodiments, (x) can be about 0.15. However, (x) can be other values as well.

Figure 3:
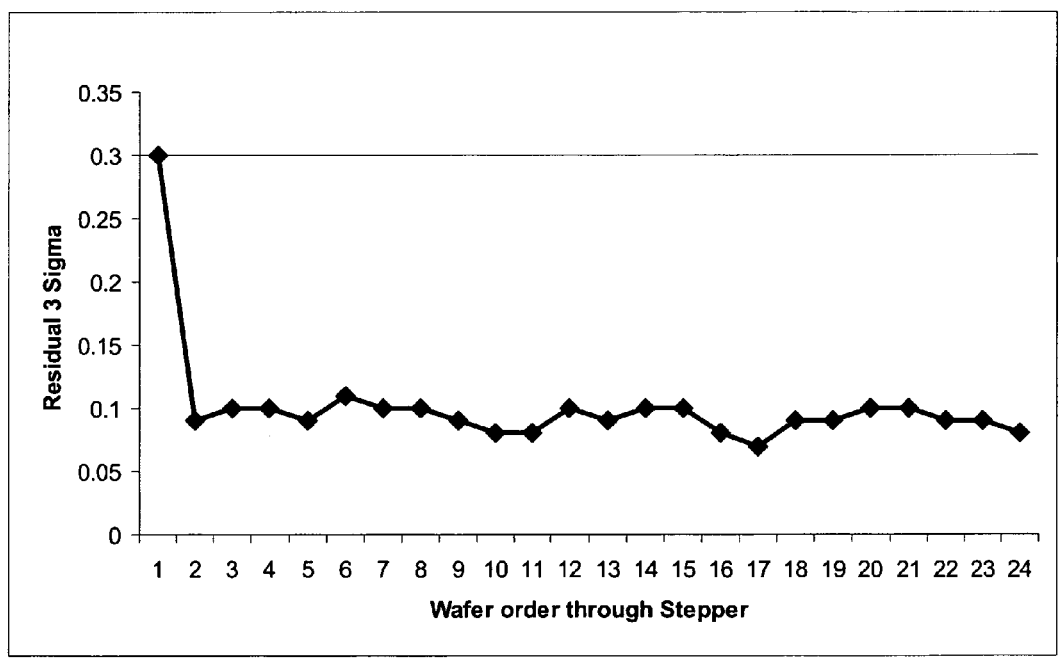
FIG. 3 illustrates a graph after a series of wafers have been inspected during manufacturing.

FIG. 3 shows Residual 3 Sigma data for individual wafers of a lot processed in a particular stepper at a particular step of processing. In FIG. 3, the X axis represents the order of the wafers in the lot as they may be processed through the stepper and the Y axis represents the Residual 3 Sigma data for each wafer in the lot. As an illustrative example, the Residual 3 Sigma values of FIG. 3 can include information about the photoresist. As shown in FIG. 3, wafer 1 has a Residual 3 Sigma value of about 0.3 and wafers 2 through 24 have Residual 3 Sigma values of about 0.1. In this illustrative example, the Residual 3 Sigma value of 0.3 provides and indication that wafer 1 may comprise a spin defect. According to various embodiments, if $(\sigma_L/\mu_L)_{Lot} - (\sigma_P/\mu_P)_P > (x)$, where (x) is a predetermined value, then the lot shown in FIG. 3 can be flagged for further investigation.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of inspecting semiconductor wafers comprising:
    comparing a value for each wafer in a lot of wafers to a mathematical model, wherein the values include data about at least one feature on each wafer, and wherein the mathematical model comprises a threshold value corresponding to the at least one feature, and further wherein values greater than the threshold value comprise an indication of a spin defect;
    determining whether any of the values of the wafers in the lot are not greater than the threshold value;
    grouping into a group (P) those wafers whose values are not greater than the threshold value;
    flagging for further inspection those wafers having values greater than the threshold value; and
    conveying an indication of the flagging to facilitate further inspection of those wafers having values greater than the threshold value.

2. The method of inspecting semiconductor wafers according to claim 1 further comprising:
    generating the mathematical model by inspecting the at least one feature for a plurality of test wafers at a given point during semiconductor processing.

3. The method of inspecting semiconductor wafers according to claim 1, wherein the threshold value includes an indication of the alignment of each wafer.

4. The method of inspecting semiconductor wafers according to claim 3, wherein the mathematical model is generated for a particular stepper tool.

5. The method of inspecting semiconductor wafers according to claim 1, wherein the step of determining whether any of the values of the wafers in the lot are not greater than the threshold value further comprises:

comparing a standard deviation ($\sigma_L$) and a mean ($\mu_L$) for the values of the features in the lot to a standard deviation ($\sigma_P$) and a mean ($\mu_P$) for the values of the features in the group (P).

6. The method of inspecting semiconductor wafers according to claim 5, wherein the values of the wafers are compared such that values greater than a predetermined threshold amount (x) indicate possible spin defects in the lot, and wherein:

$$(\sigma_L/\mu_L)_{Lot} - (\sigma_P/\mu_P)_P > (x)$$

wherein $(\sigma_L/\mu_L)_{Lot}$ represents the standard deviation of the values of the features in the lot divided by the mean of the values of the features in the lot, and further wherein $(\sigma_P/\mu_P)_P$ represents the standard deviation of the values of the features in the group (P) divided by the mean of values of the features of the group (P).

7. The method of inspecting semiconductor wafers according to claim 1, wherein the at least one feature comprises at least one alignment data selected from wafer rotation, wafer scaling, and low magnification offset.

8. The method of inspecting semiconductor wafers according to claim 1, wherein the values of the wafers comprise Residual 3 Sigma values.

9. A method of inspecting semiconductor wafers comprising:
    comparing a Residual 3 Sigma value corresponding to at least one feature on a wafer in a lot of wafers to a mathematical model, wherein the mathematical model comprises a threshold value corresponding to the at least one feature of the wafers;
    determining whether the Residual 3 Sigma value for each wafer in the lot are not greater than the threshold value;
    grouping into a group (P) those wafers whose Residual 3 Sigma value are not greater than the threshold value;
    calculating a standard deviation ($\sigma_L$) and a mean ($\mu_L$) for the Residual 3 Sigma value for the wafers in the lot;
    calculating a standard deviation ($\sigma_P$) and a mean ($\mu_P$) for the Residual 3 Sigma value for the wafers in the group (P);
    flagging the lot for further inspection if:

$$(\sigma_L/\mu_L)_{Lot} - (\sigma_P/\mu_P)_P > (x)$$

wherein (x) is a predetermined threshold amount, and wherein $(\sigma_L/\mu_L)_{Lot}$ represents the standard deviation of the Residual 3 Sigma values for the lot divided by the mean of the Residual 3 Sigma values for the lot, and further wherein $(\sigma_P/\mu_P)_P$ represents the standard deviation of the Residual 3 Sigma values for the group (P) divided by the mean of the Residual 3 Sigma values for the group (P); and
    conveying an indication of the flagging to facilitate further inspection.

10. The method of inspecting semiconductor wafers according to claim 9, wherein Residual 3 Sigma values greater than the threshold value comprise an indication of at least one of whether the wafer has a spin defect and alignment of the wafer.

11. The method of inspecting semiconductor wafers according to claim 9, wherein the mathematical model is generated for a particular stepper tool.

12. The method of inspecting semiconductor wafers according to claim 9 further comprising:
    determining the mathematical model by inspecting a plurality of test wafers; and
    wherein Residual 3 Sigma values for the plurality of test wafers are used to generate the threshold value.

13. The method of inspecting semiconductor wafers according to claim 9 further comprising:
    sending a message to a user indicating the flagged lot comprises at least one of a spin defect and a misalignment of the wafer.

14. The method of inspecting semiconductor wafers according to claim 9, wherein the number of wafers in the group (P) is at least half the number of wafers in the lot.

15. The method of inspecting semiconductor wafers according to claim 9, wherein (x) is not greater than 0.15.

16. A computer readable storage medium containing program code for enabling a computer for use in inspecting semiconductor wafers, the program code comprising:
    program code for comparing a value for each wafer in a lot of wafers to a mathematical model, wherein the values include data about at least one feature on each wafer, and wherein the mathematical model comprises a threshold value corresponding to the at least one feature, and further wherein values greater than the threshold value comprise an indication of a spin defect;
    program code for determining whether any of the values of the wafers in the lot are not greater than the threshold value;
    program code for grouping into a group (P) those wafers whose values are not greater than the threshold value;
    program code for flagging for further inspection those wafers having values greater than the threshold; and
    program code for conveying an indication of the flagging to facilitate further inspection of those wafers having values greater than the threshold value.

17. The computer readable storage medium for inspecting semiconductor wafers according to claim 16, wherein the values of the wafers comprise Residual 3 Sigma values.

18. The computer readable storage medium for inspecting semiconductor wafers according to claim 17 further comprising:
    program code for calculating a standard deviation ($\sigma_L$) and a mean ($\mu_L$) for the Residual 3 Sigma values for the wafers in the lot;
    program code for calculating a standard deviation ($\sigma_P$) and a mean ($\mu_P$) for the Residual 3 Sigma values for the wafers in the group (P); and
    program code for flagging the lot for further inspection if:

$$(\sigma_L/\mu_L)_{Lot} - (\sigma_P/\mu_P)_P > (x)$$

wherein (x) is a predetermined threshold amount, and wherein $(\sigma_L/\mu_L)_{Lot}$ represents the standard deviation of the Residual 3 Sigma values for the lot divided by the mean of the Residual 3 Sigma values for the lot, and further wherein $(\sigma_P/\mu_P)_P$ represents the standard deviation of the Residual 3 Sigma values for the group (P) divided by the mean of the Residual 3 Sigma values for the group (P).

* * * * *